United States Patent
Biber et al.

(10) Patent No.: US 11,016,163 B2
(45) Date of Patent: May 25, 2021

(54) MAGNETIC RESONANCE APPARATUS AND GRADIENT MAGNETIC FIELD-DEPENDENT CONTROL THEREOF

(71) Applicant: Siemens Healthcare GmbH, Erlangen (DE)

(72) Inventors: Stephan Biber, Erlangen (DE); David Grodzki, Erlangen (DE); Katharina Hesels, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/458,773

(22) Filed: Jul. 1, 2019

(65) Prior Publication Data

US 2020/0011954 A1  Jan. 9, 2020

(30) Foreign Application Priority Data

Jul. 9, 2018 (EP) .................................. 18182458

(51) Int. Cl.
*G01V 3/00* (2006.01)
*G01R 33/565* (2006.01)
*G01R 33/385* (2006.01)

(52) U.S. Cl.
CPC ..... *G01R 33/56572* (2013.01); *G01R 33/385* (2013.01)

(58) Field of Classification Search
CPC .............. G01R 33/3415; G01R 33/543; G01R 33/5659; G01R 33/36; A61B 5/055
USPC ........................................................ 324/307
See application file for complete search history.

(56) References Cited

U.S. PATENT DOCUMENTS

| | | | |
|---|---|---|---|
| 2002/0105329 A1* | 8/2002 | Heid | G01R 33/385 324/318 |
| 2004/0017195 A1 | 1/2004 | Kassai et al. | |
| 2012/0290135 A1* | 11/2012 | Bentivegna | G05B 13/02 700/276 |
| 2015/0177345 A1* | 6/2015 | Ham | G01R 33/3671 324/309 |
| 2016/0282431 A1* | 9/2016 | Dewdney | G01R 33/56563 |
| 2016/0339761 A1* | 11/2016 | Enomoto | B60H 1/00278 |

(Continued)

FOREIGN PATENT DOCUMENTS

DE        102016200549 A1    7/2017

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In an magnetic resonance imaging (MRI) system and a method for controlling a magnetic field gradient applied in the MRI system during an imaging sequence, a first gradient parameter representing a first maximum value of the applicable magnetic field gradients applied over time is determined in view heat generated by the applied magnetic field gradients. A second gradient parameter representing a second maximum value of the applicable magnetic field gradients applied over time is also determined in view heat generated by the applied magnetic field gradients, the second maximum value being different from the first maximum value. A current operating parameter of the MRI system is determined, and either the first gradient parameter or the second gradient parameter is selected for the imaging sequence, dependent on the determined current operating parameter.

14 Claims, 2 Drawing Sheets

(56) References Cited

U.S. PATENT DOCUMENTS

2017/0153307 A1 6/2017 Kawajiri et al.
2017/0205483 A1 7/2017 Feiweier et al.

* cited by examiner

MAGNETIC RESONANCE APPARATUS AND GRADIENT MAGNETIC FIELD-DEPENDENT CONTROL THEREOF

BACKGROUND OF THE INVENTION

Field of the Invention

The present invention concerns a method for controlling a magnetic resonance (MR) apparatus dependent on a magnetic field gradient that is to be applied in the MR apparatus during an imaging sequence. The present invention also concerns an MR system and a non-transitory, computer-readable data storage medium that implements such a method.

Description of the Prior Art

For the generation of magnetic resonance images (MR images) of an object under investigation, radio-frequency (RF) pulses are radiated into the object in order to excite certain nuclear spins of the object under examination. Magnetic field gradients are applied during an image sequence in order to spatially encode the location of the detected MR signal, which is detected with RF receiving coils. These magnetic field gradients have to be switched (activated) in a short timeframe, and high amplitudes are needed in order to generate such strong magnetic field gradients. This means that high currents are needed in order to produce the magnetic field gradients that are emitted using gradient coils. The high currents lead to heating of the magnetic field gradient coil module that generates the magnetic field gradients, as well as heating of the gradient power amplifier. Overheating of the gradient module or the gradient power amplifier is conventionally avoided with the use of a cooling system that uses water or air to cool the corresponding components.

Such a cooling system has defined operating parameters and can provide a maximum cooling capacity or cooling rate. The maximum cooling rate influences the imaging parameters that can be set by a user of the MRI system when preparing an imaging sequence, because this limits the maximum magnetic field gradients that can be used. Currently, the imaging parameters can be set by a user such that an imaging sequence could be continuously repeated without overheating the system. This controlling is known under the name "run once, run ever" (RORE). Different imaging sequences have different requirements for the magnetic field gradients. As an example, diffusion weighted imaging sequences have magnetic field gradients with high amplitudes over a longer time period, so for these imaging sequences, a high cooling capacity is needed. However, these imaging sequences are rarely repeated very often in daily clinical use.

In most MRI systems, a limit for the average gradient amplitude applied over time is provided, which cannot be exceeded during imaging. This gradient parameter is defined so that the cooling module can provide enough cooling capacity for the gradient module that provides the magnetic field gradients. For diffusion weighted imaging sequences, this means that a minimum repetition time TR is provided by the system, which precludes shorter repetition times from being set by the user, in order to avoid an overheating of the system.

This situation has the drawback that a very rigid and inflexible control is provided for the maximum field gradients applied during an imaging sequence. Most of the time, the magnetic imaging sequences requiring very high gradient amplitudes are not repeated over a long period of time.

DE 10 2016 200 549 A1 discloses a method for controlling imaging parameters in an MRI system in which operating parameters can be adapted within certain limits.

Accordingly, a need exists to provide an MRI system in which the magnetic field gradients can be controlled in a more flexible way.

SUMMARY OF THE INVENTION

In the method for controlling a magnetic field gradient applied in an MRI system during an imaging sequence, a first gradient parameter representing a first maximum value of the applicable magnetic field gradients applied over time is determined in view of heat generated by the applied magnetic field gradients. Furthermore, a second gradient parameter representing a second maximum value of the applicable magnetic field gradients applied over time is determined in view of heat generated by the applied magnetic field gradients. The second maximum value is different from the first maximum value. Furthermore, a current operating parameter of the MRI system is determined and one of the first gradient parameter and the second gradient parameter is selected for the imaging sequence in dependence of the determined current operating parameter.

The present invention provides at least two different gradient parameter values. As a current operating parameter of the MRI system is determined the gradient parameter can be selected taking into account the current operating situation of the MRI system. As an example, when it is determined that imaging sequences having higher magnetic field gradients are only applied over a short period of time, higher maximum values of the gradient parameters may be allowed compared to a situation where imaging sequences are used which use high gradient values over a longer period of time. Accordingly, the controlling of the magnetic field gradients can be adapted to the current operating conditions and it may be possible to allow shorter repetition times compared to the present situation, especially for diffusion weighted imaging sequences when it is determined that these imaging sequences needing high field gradients are only applied over a relatively short period of time, e.g. not longer than 5 to 10 minutes.

The determined first gradient parameter and the determined second gradient parameter can be proportional to an electric power generated by the current needed to generate the magnetic field gradients in the imaging sequence. Accordingly, the MRI system provides two different threshold values that define the maximum electric power or the maximum current applied over a defined time period. Because the generated heat is mainly due to the large currents needed to generate the magnetic field gradients the generated electric power is a measure for the heat generated by the magnetic field gradients. The cooling system of the MRI system provides a certain cooling capacity and based on the cooling capacity and based on the evaluation of the applied currents over time higher currents may be acceptable for a shorter period of time compared to a situation where high currents are needed to generate the magnetic field gradients, which is either run forever or run over a longer period of time.

Preferably the first gradient parameter represents the first maximum value of the magnetic field gradients used in a first use scenario in which the imaging sequence that is repeated over a first period of time, and the second gradient parameter represents the second maximum value of the magnetic field gradients used in a second use scenario in which the imaging sequence that is repeated over a second period of time that is longer than the first period of time. In this scenario, the first maximum value is higher than the second maximum value. Here the first maximum value can be higher because the maximum magnetic field gradient is applied over a shorter period of time, compared to the second maximum value that is designed such that the magnetic field gradients using the second maximum value can be applied over a longer period, e.g. continuously, or which could even be run forever without overheating the system.

With regard to the operating parameter that is determined, the magnetic field gradients which were or will be applied in the MRI system can be determined in a defined time period before selecting either the first or the second gradient parameter. This can include determining the magnetic field gradients that are present in an imaging sequence queue to be applied to a person, so that when a further imaging sequence is selected, the further imaging sequence can be controlled such that it is checked whether imaging sequences are applied that need high magnetic field gradients that are already present, or that were already run on the system, or that will be run in the near future.

Furthermore, it is possible to determine the temperature of the cooling module that is used to cool the gradient module that generates the magnetic field gradients. Additionally, or as an alternative, the temperature present in the gradient module itself is used to either select the first gradient parameter or the second gradient parameter as threshold values for imaging sequences.

It is possible to adapt the controlling in such a way that the MRI system starts with the first maximum value as a start value which is the value allowing the higher magnetic field gradients compared to the second maximum value. During operation it is then checked whether it is necessary to switch to the second maximum value. By way of example when the determined operating parameter indicates that a cooling capacity would be exceeded if the future imaging sequences were using magnetic field gradients having maximum values, the MRI system may switch to the second maximum value.

Furthermore, it is possible to determine a historic gradient parameter indicating the magnetic field gradients applied during imaging sequences applied in the MRI system in the past. The first and/or the second gradient parameter can then be determined based on the historic gradient parameter. In this embodiment the imaging sequences applied over the past, e.g. the past weeks or months could be checked and it is determined whether many imaging sequences with high magnetic field gradients are used. Based on this detection, either the first gradient parameter or the second gradient parameter, or both gradient parameters, may be determined based on this historic data. In this context it is possible to check only whether diffusion weighted imaging sequences were used in the previously executed imaging sequences, because it is mainly due to this type of imaging sequences that the maximum cooling capacity of the MRI system is actually needed.

Furthermore, the corresponding MRI system according to the invention has an MR data acquisition scanner with a gradient module designed to generate the magnetic field gradients, and a gradient controller configured to control the magnetic field gradients applied during an imaging sequence as described above.

The present invention also encompasses a non-transitory, computer-readable data storage medium encoded with programming instructions (program code) that, when the storage medium is loaded into a control computer of an MRI system, cause the control computer to operate the MRI system in accordance with any or all embodiments of the method according to the invention, as described above.

The features mentioned above and features explained below apply not only in the respective combinations indicated, but also in other combinations or in isolation without departing from the scope of the present invention. Features of the above-mentioned aspects and embodiments described below may be combined with each other in other embodiments, unless explicitly stated otherwise.

DESCRIPTION OF THE PREFERRED EMBODIMENTS

Figure 1:
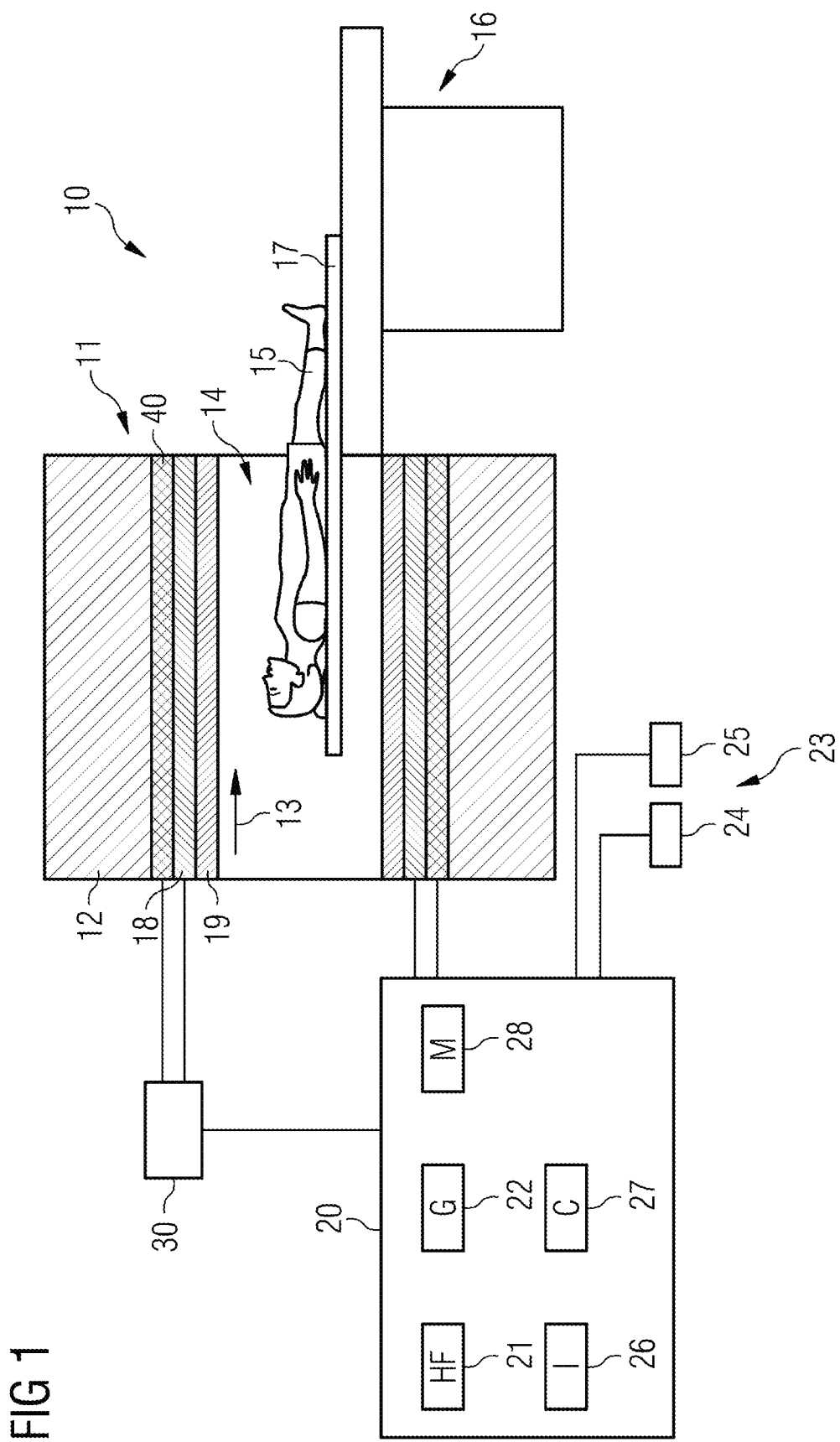
FIG. 1 shows an MRI system according to the invention designed to flexibly control the maximum magnetic field gradients applied during an examination.

In the following, embodiments of the invention are described in detail with reference to the accompanying drawings. It is to be understood that the following description of embodiments is not to be considered in a limiting sense. The scope of the invention is not intended to be limited by the embodiments described hereinafter or by the drawings, which are for illustrative only.

The drawings are to be regarded as being schematic representations, and elements illustrated in the drawings are not necessarily shown to scale. Rather the various elements are presented such that their function and general-purpose becomes apparent to a person skilled in the art. Any connection or coupling between functional blocks, devices, components of physical or functional units shown in the drawings and described hereinafter may also be implemented by an indirect connection or coupling. A coupling between components may be established over a wired or wireless connection. Functional blocks may be implemented in hardware, software, firmware, or a combination thereof.

FIG. 1 schematically depicts a magnetic resonance imaging system 10. The MRI system 10 has an MR data acquisition scanner 11, which has a basic field magnet 12 that generates a basic magnetic field B0, which is indicated in FIG. 1 by arrow 13. The scanner 11 has a patient receiving area 14 that, in the embodiment shown, is cylindrically enclosed by the magnet 12. The object to be examined, here the patient 15, is moved into the patient receiving area 14 by a positioning device 16, which moves a patient table 17 into the MRI system.

Furthermore, the scanner 11 includes a gradient module 18 that generates the magnetic field gradients, which are used for the spatial encoding during the imaging sequence. The gradient module 18 can have three different physical gradient coils that respectively generate magnetic field gradients in three different directions. Furthermore, an antenna unit 19 is provided, embodied as body coil. The antenna unit 19 is designed to excite the spins of the examined person 15. Furthermore, additional transmission and or receiving coils (not shown) may be provided closer to the examined object, especially to detect the magnetic resonance signal after the signal excitation. How MRI images of the examined person 15 are generated with RF pulses and the switching of magnetic field gradients is known to those skilled in the art and thus need not be explained in more detail herein.

The scanner 11 furthermore has a cooling module 40 designed to dissipate heat generated by the gradient module 18. The cooling module 40 may use water for cooling and has a defined cooling capacity.

The MRI system 10 has a system control computer 20 that controls the different components of the MRI system 10. The control computer 20 includes a radio-frequency controller 21 that generates and controls the RF pulses that are applied to the patient 15. A gradient controller 22 controls the magnitude and the time periods of the applied magnetic field gradients. A user interface 23 is linked to the system control computer 20. Control information such as imaging parameters and the reconstructed MR images can be displayed on a display unit 24 of the user interface. Additionally, an input unit 25 is provided, which can be used by the operator of the MRI system to enter the required information, such as operating parameters, the selection of imaging sequence planes, et cetera.

The system control computer 20 furthermore has an image sequence controller 26 that, based on the selected imaging sequence, controls how magnetic field gradients, RF pulses and signal detection are applied over time. A processor 27 controls the overall operation of the different system components, and a memory 28 is provided that can be used to store the MRI images, the imaging sequences, and program code that is executed by any of the components of the system control computer 20 or the processor 27 in order to carry out the method for controlling the allowable magnetic field gradients applied during an imaging sequence.

In the following a method is explained in which a first gradient parameter is determined which represents the maximum gradient power or the maximum value of the applicable magnetic field gradients that can be applied over time. Furthermore, a second gradient parameter representing a second maximum value different from the first value is determined. These two gradient parameters represent different use cases how imaging sequences especially image sequences with high magnetic field gradients such as 30, 40 or 80 mT/m are used by the MRI system 10. These 2 use cases are in line with the maximum cooling capacity that can be achieved with the cooling module 40. The cooling capacity can indicate the cooling power or the amount of heat that can be dissipated by the cooling module over a certain time period such as intervals between 10 and 100 minutes. The selection of one of the gradient parameters, here the first gradient parameter or the second gradient parameter now depends on the operating parameter of the MRI system.

As an example, the first gradient parameter can be determined such that it represents a first use scenario of the MRI system wherein the scenario can indicate how often certain imaging sequences needing high magnetic field gradients such as diffusion weighted imaging sequences are used. It is possible to have a cooling capacity for a scenario in which a diffusion weighted imaging sequence having an acquisition time of 3 minutes is repeated three times directly one after the other. Accordingly, the cooling capacity is such that it can dissipate the heat generated by the currents used to generate the magnetic field gradients. This means that a large amount of heat is generated for by way of example 8 to 12 minutes for the example given above wherein before or after this high heat generating period other imaging sequences are used which generate considerably less heat, e.g. between 30 to 70% less heat. The gradient parameter may be a value provided for each of the gradient axes and is proportional to the square of the current applied in the corresponding direction. Accordingly, the gradient parameter is proportional to the electric power generated by the current.

Furthermore, a second gradient parameter can be determined based on a second use scenario which is designed such that a magnetic imaging sequence needing high magnetic field gradients is applied over several hours or even forever continuously. This second gradient parameter is selected such that the cooling capacity provided by the MRI system can still cope with this situation. It is clear from the above discussion that in this scenario the second maximum value defined by the second gradient parameter is lower than the first value as the cooling module has to be able to dissipate the generated heat over a much longer period of time. Further it is possible that a third gradient parameter is provided in the system describing a still further use scenario of the magnetic field gradients. By comparing the present operating parameter to the different gradient parameters, one of them can be selected as future limit for the applied magnetic field gradients.

During the planning of an examination of the patient 15, it is now determined which of the two gradient parameters is used as a maximum value. The gradient parameter means that the user cannot select imaging parameters such that magnetic field gradients higher than the corresponding maximum value defined by the gradient parameters can be applied. Accordingly, the gradient parameters limit the possible maximum values of the applied magnetic field gradients.

Referring back to FIG. 1, this means that the gradient controller 22 selects either the first gradient parameter or the second parameter depending on an operating parameter of the MRI system 10 which is also determined by the gradient controller 22 or which may be fed to the gradient module 18 by any of the other components. The operating parameter can include a temperature either of the gradient module 18 or of the cooling module 40 as determined by a temperature sensor 30. Furthermore, the operating parameter may include the amount and the duration of the previously run imaging sequences, especially the imaging sequences having high gradient requirements i.e. imaging sequences using magnetic field gradients higher than a threshold. In addition to the already terminated imaging sequences, it is possible to determine the imaging sequences which are already scheduled, by way of example in an imaging queue. When the gradient control module determines that high magnetic field gradients will be applied during the next 10 to 15 minutes as three or four imaging sequences are scheduled in the imaging queue, the further sequence to be input into the imaging queue may be controlled such that not the first gradient parameter, but only the second gradient parameter may be applied so that the user can only select the new imaging sequence such that lower maximum gradients can be applied.

This allows a more realistic definition of the cooling capacity adapted to a more realistic use scenario. Furthermore, it allows the use of imaging scenarios which would not have been possible without the use of two different gradient parameters.

As noted above, the second gradient parameter may be selected such that the imaging sequence applying the maximum value of the field gradient is used continuously over several hours and the cooling module is still able to dissipate the generated heat. However, in another scenario the second gradient parameter may also be selected such that not an infinite repetition of the imaging sequence using high field gradients is allowed, but only a more realistic repetition such up to 30 to 60 minutes. Accordingly, in such a scenario the second maximum value of the possibility magnetic field gradient may be higher compared to a scenario where the second maximum value is limited by an imaging sequence which is run forever. When the second gradient parameter is defined such that the cooling module does not have to be able to dissipate the heat generated by a system in which the imaging sequence is run forever, more than 99% of the use cases are covered.

Figure 2:
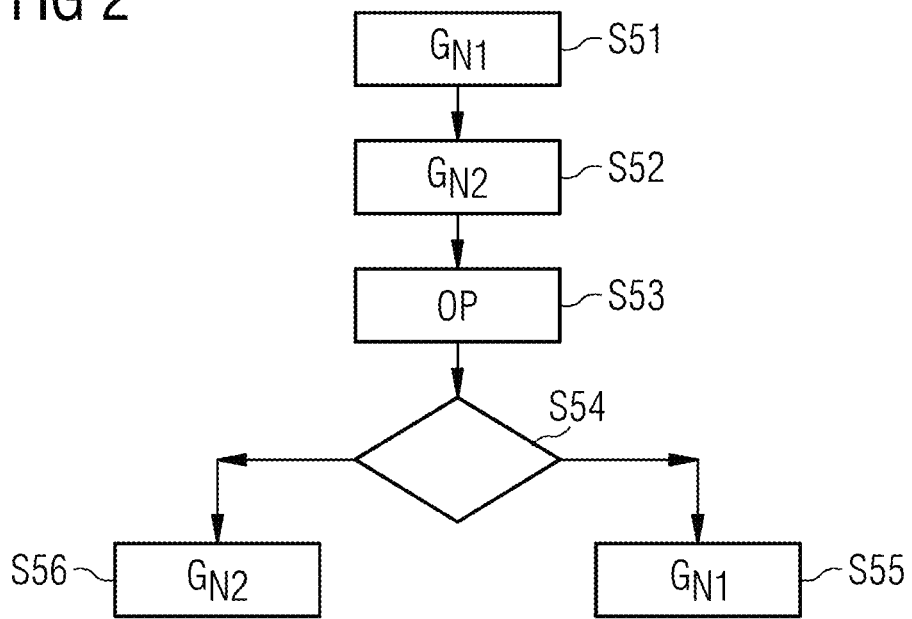
FIG. 2 is a flowchart showing the basic steps according to the invention for controlling the magnetic field gradients applied in an MRI system during the imaging sequence.

FIG. 2 summarizes some of the basic steps carried out in the above-discussed method. In a first step S51 the 1st gradient parameter $G_{N1}$ representing the first maximum value is determined. This first gradient parameter $G_{N1}$ describes a first use scenario in which imaging sequences needing high magnetic field gradients such as diffusion weighted imaging sequences are not applied forever. Furthermore, in step S52 at least one second gradient parameter $G_{N2}$ is determined which is applicable to another use scenario, e.g. the maximum value of the field gradient is defined such that the cooling capacity is able to dissipate the generated amount of heat when the corresponding imaging sequence is applied forever. This can mean that the gradient parameters are read from a memory such as memory 28, or it means that they are determined on the fly, e.g. taking into account historic magnetic field gradient strength data stored and collected by the system. The historic data help to determine how often field gradients higher than a certain threshold are actually used. Based on the historic data the first and second gradient parameters can be determined and stored in the system. As discussed above, in step S52 the second gradient parameter may also be determined for a use scenario where the imaging sequence needing gradient values close to the maximum allowed values are not applied forever but are applied and repeated for a predetermined number of times, by way of example a number between 10 and 50, or are applied over a time period longer than the time period used in the first use scenario, e.g. 30 min or 1 h. As an alternative, the gradient parameter is determined based on a use scenario that the gradients are applied forever without overheating the system. In step S53 the current operating parameter OP is determined such that the temperature in the cooling module or the temperature in the gradient module itself is below a threshold Th. As discussed above the operating parameter OP may also include the amount and the duration of the other imaging sequences which were either run or which are scheduled before the current imaging sequence to be controlled. In step S54 the value of the current operating parameter OP is checked and depending on the result, by way of example depending on the determined temperature or the determined gradient history, the first gradient parameter $G_{N1}$ is selected in step S55 or the second gradient parameters $G_{N2}$ is selected in step S56.

Figure 3:
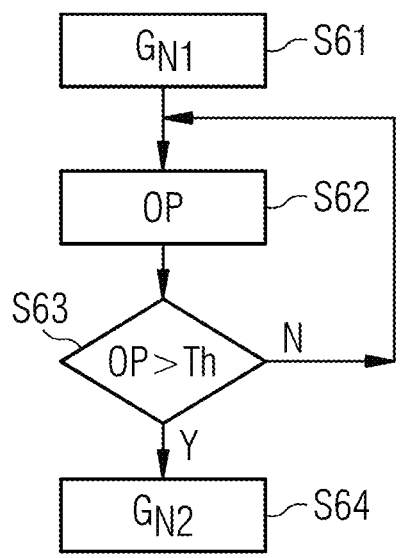
FIG. 3 is a further flowchart showing the basic steps according to the invention for controlling the magnetic field gradients in an MRI system during an imaging sequence.

FIG. 3 shows a further scenario in which as a default value for the control of the magnetic field gradients in step S61 the first gradient parameter $G_{N1}$ is selected. Accordingly, the user can select the imaging parameters such as repetition time etc. such that the maximum values of the magnetic field gradients do not exceed the first maximum value defined by the first gradient parameter under the assumption that gradient values higher than a threshold, i.e. values close to the maximum allowed values are only applied over a limited period of time, e.g. between 10 min and 30 min. In step S62 the operating parameter OP is determined as discussed above in connection with step S53. In step S63 it is then checked whether it is possible to continuously use the first gradient parameter $G_{N1}$ as threshold value. By way of example, if the determined operating parameter OP is larger than a threshold, e.g. the temperature is higher than a threshold value or the time duration of imaging sequences needing high gradients is higher than a threshold, the system switches to another gradient parameter (e.g. the second gradient parameter), in step S64 in order to avoid that the cooling capacity of the cooling module is exceeded. If more than 2 gradient parameters are provided it can be determined which of the other gradient parameters is selected based on operating parameter. If no threshold limits are exceeded, the system continues with the first gradient parameter for the control of the maximum value of the applicable magnetic field gradient.

In the examples described above, 2 different gradient parameters are available for the control of the maximum magnetic field gradients. However, it should be understood that more than 2 or at least two different gradient parameters can be provided for the control, e.g. a third or fourth gradient parameter lying between the limits of the first and second gradient parameter. This means a further gradient parameter may be provided defining another time period for the continuous application of the field gradients. Here the first gradient parameter would allow an application for a short time period such as 10 to 15 min, a second gradient parameter would allow an application of the gradient fields over a second time period longer than the short time period (e.g. 30 min), and a third gradient parameter would allow an application of the magnetic field gradients forever or over a longer time period than the second time period without overheating the gradient module (e.g. over 1 or 2 h).

The above described invention allows to consider different use scenarios for an MRI system in which the maximum field gradients applied during the imaging sequences are adapted such that for different use scenarios the cooling module is able to provide the required cooling necessary not to overheat the system. It provides a balance between the maximum possible gradient values and the actually used gradient values and the system can be adapted based on the use history so that a sequence of image sequences is possible which would not be possible when a single fixed maximum gradient value is used. The use scenarios can include realistic scenarios occurring in a hospital environment, or other use scenarios for a research department where imaging sequences may be used in a different way. The present invention can deal with all these cases while avoiding that an overheating of the system occurs. Nevertheless higher maximum values of magnetic field gradients may be allowed over a defined period of time, e.g. between 10 to 30 minutes, but not over one hour.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for controlling a magnetic field gradient applied in a magnetic resonance imaging (MRI) system during an imaging sequence, said method comprising:
    in a computer, determining a first gradient parameter representing a first maximum value of the applicable magnetic field gradients applied over time in view of heat generated by the applied magnetic field gradients, the first gradient parameter being useable in a first use scenario in which the imaging sequence is repeated over a first period of time;

in said computer, also determining a second gradient parameter representing a second maximum value of the applicable magnetic field gradients applied over time in view of heat generated by the applied magnetic field gradients, the second gradient parameter being useable in a second use scenario in which the imaging sequence is repeated over a second period of time longer than the first period of time, wherein the first maximum value is higher than the second maximum value;

in said computer, determining a present operating parameter of the MRI system; and via said computer, selecting one of the first gradient parameter and the second gradient parameter for the imaging sequence based on the determined present operating parameter.

2. A magnetic resonance imaging (MRI) system comprising:

an MRI data acquisition scanner comprising a gradient coil arrangement operated by a gradient controller;

said gradient controller being configured to:

determine a first gradient parameter representing a first maximum value of the applicable magnetic field gradients applied over time in of view heat generated by the applied magnetic field gradients, the first gradient parameter being useable in a first use scenario in which the imaging sequence is repeated over a first period of time;

determine a second gradient parameter representing a second maximum value of the applicable magnetic field gradients applied over time in view of heat generated by the applied magnetic field gradients, the second gradient parameter being useable in a second use scenario in which the imaging sequence is repeated over a second period of time longer than the first period of time, wherein the first maximum value is higher than the second maximum value;

determine a present operating parameter of the MRI system; and select one of the first gradient parameter and the second gradient parameter for the imaging sequence based on the determined present operating parameter.

3. A non-transitory, computer-readable data storage medium encoded with programming instructions, said storage medium being loaded into a gradient controller of a magnetic resonance imaging (MRI) apparatus comprising a gradient coil arrangement operated by the gradient controller, said programming instructions causing said gradient controller to:

determine a first gradient parameter representing a first maximum value of the applicable magnetic field gradients applied over time in view of heat generated by the applied magnetic field gradients, the first gradient parameter being useable in a first use scenario in which the imaging sequence is repeated over a first period of time;

also determine a second gradient parameter representing a second maximum value of the applicable magnetic field gradients applied over time in view of heat generated by the applied magnetic field gradients, the second gradient parameter being useable in a second use scenario in which the imaging sequence is repeated over a second period of time longer than the first period of time, wherein the first maximum value is higher than the second maximum value;

determine a present operating parameter of the MRI system; and select one of the first gradient parameter and the second gradient parameter for the imaging sequence based on the determined present operating parameter.

4. The method according to claim 1, comprising determining the first and second gradient parameters so as to be proportional to an electric power generated by a current needed to generate the magnetic field gradients.

5. The method according to claim 1, comprising determining the second gradient parameter so as to represent the second maximum value of the magnetic field gradients allowable in the imaging sequence that is continuously repeated in the MR system without overheating the MRI system.

6. The method according to claim 1, comprising starting the method for controlling the magnetic field gradient with the first maximum value as a start value, independent of the determined operating parameter.

7. The method according to claim 6, comprising switching the method switches to the second maximum value when the determined operating parameter indicates that a cooling capacity of the MRI system is exceeded when future imaging sequences use magnetic field gradients with maximum values as defined by the first maximum value.

8. The method according to claim 1, comprising determining the operating parameter by determining the magnetic field gradients applied in the MRI system in a defined time period before selecting either the first gradient parameter or the second gradient parameter.

9. The method according to claim 1, comprising determining the operating parameter comprises by determining a temperature in at least one of a cooling module used to cool a gradient module that generates the magnetic field gradients in the MRI system, and a temperature present in the gradient module used to generate the magnetic field gradients.

10. The method according to claim 1, further comprising determining a historic gradient parameter indicating the magnetic field gradients applied during imaging sequences previously applied in the MRI system, and determining at least one of the first and second gradient parameters based on the determined historic gradient parameter.

11. The method according to claim 10, comprising using only diffusion weighted imaging sequences when determining the historic gradient parameter.

12. The method according to claim 1, wherein the present operating parameter corresponds to a present operating situation of the MRI system.

13. The method according to claim 1, wherein the present operating parameter of the MRI system comprises a temperature of a gradient module configured to generate the magnetic field gradients and/or a temperature of a cooling module configured to cool the gradient module.

14. The method according to claim 1, wherein the present operating parameter of the MRI system comprises an amount and/or duration of a previously run imaging sequences.

* * * * *